US00RE40031E

(19) United States
(12) Reissued Patent
Goos

(10) Patent Number: US RE40,031 E
(45) Date of Reissued Patent: Jan. 22, 2008

(54) TEMPERATURE COMPENSATED POWER CONTROL CIRCUIT

(75) Inventor: Jeffrey J. Goos, San Diego, CA (US)

(73) Assignee: Uniden America Corporation, Fort Worth, TX (US)

(21) Appl. No.: 09/957,546

(22) Filed: Sep. 20, 2001

Related U.S. Patent Documents

Reissue of:
(64) Patent No.: 5,956,627
Issued: Sep. 21, 1999
Appl. No.: 08/889,318
Filed: Jul. 8, 1997

(51) Int. Cl.
*H04B 1/04* (2006.01)
*H04B 17/00* (2006.01)

(52) U.S. Cl. ..... 455/127.1; 455/126; 455/115.1
(58) Field of Classification Search ..... 455/126, 455/127.1, 115.1, 111, 124; 330/138, 140; 327/330, 513
See application file for complete search history.

(56) References Cited

U.S. PATENT DOCUMENTS 3,947,706 A * 3/1976 Holmes ..... 327/538
4,319,196 A * 3/1982 Kwan ..... 329/352
4,523,155 A * 6/1985 Walczak et al. ..... 330/279
4,970,456 A * 11/1990 Holcomb et al. ..... 324/95
5,113,336 A * 5/1992 Takahashi et al. ..... 363/61
5,196,806 A * 3/1993 Ichihara ..... 330/137
5,337,006 A * 8/1994 Miyazaki ..... 330/138
5,392,464 A * 2/1995 Pakonen ..... 455/115.1
5,487,184 A * 1/1996 Nagode ..... 455/126
5,659,253 A * 8/1997 Busking ..... 324/648
5,678,209 A * 10/1997 Strakovsky ..... 455/126
5,732,332 A * 3/1998 Iida ..... 455/117
5,796,309 A * 8/1998 Nguyen ..... 330/289
6,084,920 A * 7/2000 Ferdinandsen ..... 375/297

OTHER PUBLICATIONS

R.S.Twner (A Temperature stabilized RF detector with extended dynamic Range) 1982, Bell Laboratories.*
Article by Ronald J. Turner, entitled "A Temperature Stabilized RF Detector with Extended Dynamic Range", 32$^{nd}$ *IEEE Vehicular Technology Conference in San Diego,* May 1982 pp. 231–242.
Article by Roland J. Turner, entitled "Schottky Diode Pair Makes an RF Detector Stable", *Electronics Magazine,* May 2, 1974, pp. 94 and 95.
Article by Raymond W. Waugh, entitled "Designing Large–Signal Detectors for Handsets and Base Stations", *Wireless Systems Design,* Jul. 1997, pp. 42, 44, 46 and 47.

* cited by examiner

*Primary Examiner*—Tilahun Gesesse
(74) *Attorney, Agent, or Firm*—Sidley Austin LLP

(57) ABSTRACT

A temperature compensation technique employing a directional coupler providing signals from a forward sample port to a detector circuit for providing a DC output representative of transmitted power. A temperature compensation circuit including a current source is coupled to a reverse sample port of the directional coupler for providing a compensating DC bias current via said coupler, to the detector circuit. The detector circuit and the temperature compensation circuit each include matched diodes and corresponding circuits for tracking temperature and offsetting the effects of temperature on the DC output of the detector circuit.

23 Claims, 1 Drawing Sheet

TEMPERATURE COMPENSATED POWER CONTROL CIRCUIT

Matter enclosed in heavy brackets [ ] appears in the original patent but forms no part of this reissue specification; matter printed in italics indicates the additions made by reissue.

TECHNICAL FIELD OF THE INVENTION

The present invention relates in general to power detection and measurement circuits, and more particularly to temperature compensated power control circuits as utilized in wireless transceivers.

BACKGROUND OF THE INVENTION

The transmission level of signals, in terms of transmitter wattage output, is often required to remain within specified tolerances. For example, the output power transmitted by cellular radio telephones and mobile radios is governed by Federal Regulations. If insufficient RF power is produced to transmit a modulated carrier, the receiver cannot accurately demodulate the voice signals and decode the data. If a transmitter transmits the carrier signal with too much power, the performance of adjacent channels may be affected and possible jamming thereof may result.

In many wireless communication systems, the receiver often includes circuits for measuring the signal strength of received signals. A coded signal is then transmitted by the receiver to a base station to indicate the signal strength of the carrier received by the receiver. The base station then dispatches a transmission to the transmitter to increase or decrease the power by which the modulated carrier is transmitted. Once the power level is set, it is maintained at such level, until signaled by the base station to again change the transmitter power level. In practice, the power level of a transmitter may change frequently, due to distance, obstructions, etc., between the transmitter and receiver. Once the power level of a transmitter is established by the base station, or otherwise, the transmitter circuits sense the power level and maintain such level within predefined limits.

The measurement of power output by a transmitter can be accomplished in many different ways. One technique for sensing the transmitted power is to sense the peak voltage of the transmitter carrier and utilize the peak voltage magnitude for comparison with a reference. Although this technique provides an accurate representation of the transmitted power, the associated circuitry is complex, costly and often component intensive.

The most common technique for measuring transmitter power is to sample a portion of the power produced by the transmitter and convert the sampled signal to a DC voltage. The DC voltage is then compared with a reference level by the use of a comparator, or the like. An error signal is generated and fed back to the transmitter to control the transmitter power accordingly.

The sampling of the transmitted power can be efficiently accomplished by the use of a directional coupler. With such a device, the forward transmitted power is sampled and provided as an output at a "forward" port of the device. In the event reflected power is of interest, the reflected power of a transmitter is sampled and provided as an output at a "reverse" port of the directional coupler. Again, the sampled power at the forward port is converted to a DC voltage and utilized in a feedback loop to increase or decrease the transmitter power to maintain the same at a specified level.

In any electrical circuit involving a semiconductor junction, such as in a diode or transistor, changes in the ambient temperature change the operating characteristics of the semiconductor device, thereby modifying the operating conditions. A change in the operating conditions due to temperature represents an error or inaccuracy. In diode rectifying circuits conventionally utilized in sensing transmitter power, a change in the temperature of the diode causes a change in the rectified voltage and the feedback error signal, despite the fact that the transmitter power remains constant.

To circumvent this inaccuracy due to temperature, various types of temperature compensation circuits have been devised. In U.S. Pat. No. 4,523,155 by Walczak et al, a temperature compensation circuit is connected in parallel with the rectifier circuit. With this arrangement, as the temperature attempts to change the operating characteristics of the rectifier circuit, the temperature compensation circuit provides an offsetting voltage to remove the effects of temperature changes. The disadvantage of such an arrangement is that when the temperature compensation circuit is connected in parallel with the rectifier circuit, the sensitivity to low power levels is compromised. As a result, the rectifier circuit becomes less sensitive to power level changes, especially when the transmitter operates at low power levels.

U.S. Pat. No. 5,113,336 by Takahashi et al. discloses another type of a temperature compensated level detector utilizing a directional coupler or transmission line to sample the RF power. Again, the temperature compensation circuit is shunted across the level detector that rectifies the RF current, thereby reducing the sensitivity of the level detector.

From the foregoing, it can be seen that a need exists for an improved technique in sensing power levels and providing temperature compensation without compromising the sensitivity of the circuits. Another need exists for a temperature compensated power detector that is cost effective, has few components and accurately removes the effects of changes in temperature on semiconductor components.

SUMMARY OF THE INVENTION

In accordance with the principles and concepts of the present invention, a temperature compensated detector is provided that overcomes the problems and shortcomings of the prior art designs.

According to the preferred embodiment of the invention, a four-port directional coupler is employed to sample the RF power level of a transmitter, rectify the sampled signal to provide a corresponding DC voltage, and provide temperature compensation without affecting the sensitivity of the RF detector circuit. The RF power output by the transmitter is coupled in a conventional manner to a load, via the RF input and RF output ports of the directional coupler. The forward power is sensed and provided as an output of the directional coupler at the forward sample port. A halfwave rectifier circuit is coupled to the forward sample port for rectifying and filtering the sensed RF signal and providing a corresponding DC voltage. Rather than shunting a temperature compensation circuit across the rectifier circuit, such compensation circuit is coupled to the reverse sample port of the directional coupler. The sensed signal corresponding to the reflected power provided at the reverse sample port is terminated by providing a low-impedance AC path to ground. With this arrangement, the temperature compensating signal is DC coupled internally to the forward sample port of the directional coupler by way of the reverse sample port. In this manner, the temperature compensating circuit does not load or otherwise reduce the sensitivity of the rectifier circuit.

A low-cost temperature compensated level detector is thereby provided, and which is sensitive to very low power levels.

BRIEF DESCRIPTION OF THE DRAWINGS

Further features and advantages will become apparent from the following and more particular description of the preferred embodiment of the invention, as illustrated in the accompanying drawing in which like reference characters generally refer to the same parts, elements or components throughout the views, and in which.

DETAILED DESCRIPTION OF THE INVENTION

Figure 1:
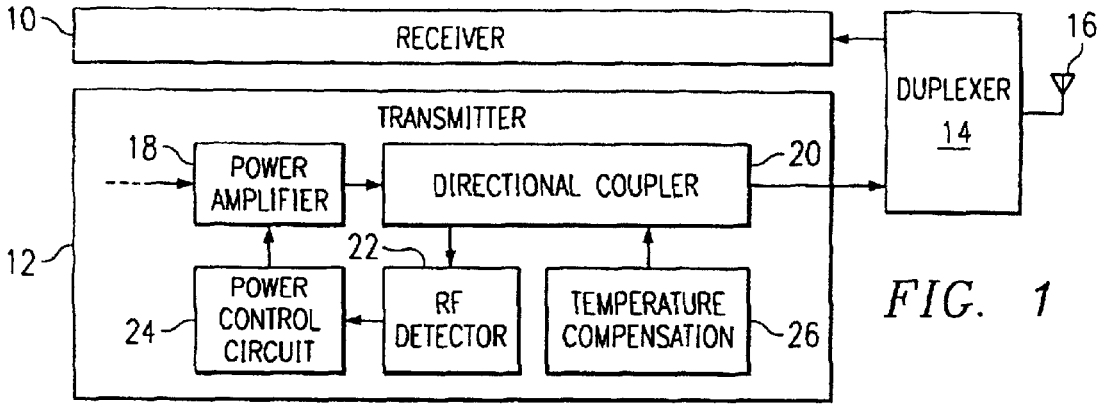
FIG. 1 illustrates in block diagram form a transceiver of the type in which the present invention can be advantageously practiced.

FIG. 1 illustrates in block diagram form a wireless transceiver of the type in which the present invention can be advantageously practiced. While the transceiver of FIG. 1 illustrates a preferred embodiment of the invention, it is noted that the invention can find a wide variety of applications in many other types of transmitters where the measurement of the output power is carried out. Also, while the invention is described in connection with RF-type transmitters, the invention is not limited to such type of transmitters.

The transceiver shown in FIG. 1 includes an RF receiver 10, an RF transmitter 12, a duplexer 14 and an antenna 16. The receiver 10 is of conventional design for receiving an RF carrier modulated with voice and/or data.

The duplexer 14 consists of switching and/or filter circuits for coupling the antenna 16 to either the receiver 10 or to the transmitter 12.

The transmitter 12 includes many voice and data processing circuits (not shown), and includes a power amplifier 18 for amplifying an RF carrier modulated with voice and/or data signals. The RF carrier transmitted by the transmitter 12 need not be the same frequency as that utilized by the receiver 10. The amplified RF carrier, as modulated by other signals, is coupled through a directional coupler 20 to the duplexer 14, which then couples the amplified signal to the antenna 16 for radiation thereof. The directional coupler 20 is of conventional design in which the amplified signal is coupled therethrough to the duplexer 14 substantially unattenuated. However, a forward sampling port of the directional coupler 20 couples a small portion of the RF energy to an RF detector circuit 22. The RF detector circuit 22 rectifies the RF signal and converts the same to a corresponding DC signal. The DC signal output by the RF detector 22 is representative of the transmitter power output by the power amplifier 18. A power control circuit 24 is provided to receive the DC signal output by the RF detector 22, compare the same to a reference level, and provide an error signal to the power amplifier 18. The error signal is of such a magnitude and polarity so as to change or modify the power output by the amplifier 18 and maintain the same at a predefined level. Should the prescribed transmitter power be intentionally changed to a new level, the reference level of the power control circuit is changed accordingly, whereupon the power amplifier 18 is caused to produce a new transmitter power output.

As noted above, insofar as RF power sensed by the RF detector 22 is rectified by solid state components, the semiconductor junctions thereof produce different operating characteristics in response to changes in temperature. As will be described more fully below, the forward junction voltage, or threshold voltage, of a semiconductor device decreases in response to an increase in temperature, and vice versa. As such, the voltage output of the RF detector 22 will change in magnitude in response to different temperatures, even if the power amplifier 18 produces a constant output wattage. In order to circumvent this inherent inaccuracy in the RF detector 22, a temperature compensation circuit 26 is provided. Importantly, the temperature compensation circuit 26 is DC coupled to a port of the directional coupler 20 that samples power reflected from the circuits of the duplexer 14 and antenna 16, back to the power amplifier 18. With this arrangement, the sensitivity to the RF detector 22 in sampling small power levels is not compromised by the addition of the temperature compensation circuits 26. As will be set forth more fully below, the apparatus and technique providing temperature compensation for the RF detector 22 is cost effective, noncomplicated and well-adapted for measuring low power levels.

Figure 2:
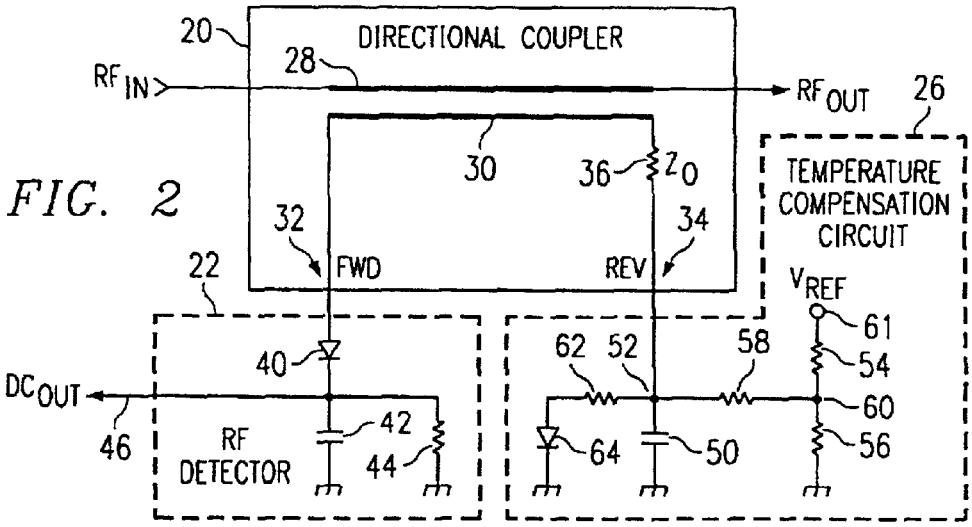
FIG. 2 is a schematic drawing of the rectifier circuit and temperature compensation circuit as coupled to the various ports of a directional coupler.

With reference to FIG. 2, there is shown the preferred form for sampling RF power, rectifying the same to produce a DC output, and providing temperature compensation. In the preferred embodiment of the invention, the RF power is coupled from the power amplifier 18 to the transmitter output circuits by way of the directional coupler 20. The directional coupler 20 is conventionally available in chip form, as type DSC3920-0836, obtainable from Taisei Ltd., Tokyo, Japan. It is noted this device employs a built-in termination 36 for the reverse port. Other types of directional couplers are available in which the matching impedance must be provided as a component connected external thereto. It is also noted that while the preferred embodiment of the invention employs such type of coupler, those skilled in the art may find that other coupling and sensing components, such as transformers, discreet directional couplers utilizing twisted wires, etc., can be employed.

Symbolically illustrated in connection with the directional coupler 20 of FIG. 2 is a main line 28 that comprises a low-impedance conductor for coupling the transmitter power from the RF input to the RF output thereof. Very little attenuation of the transmitted signal occurs while being carried by the main line 28 of the directional coupler 20. Transmitter signals carried by the main line 28 are electromagnetically coupled to a coupled line 30 of the directional coupler 20. Indeed, the RF power carried in a forward direction on the main line 28 is provided as sampled signals on a forward "Fwd" sample port 32 of the directional coupler 20. RF signals reflected from the RF output to the RF input of the directional coupler 20 are provided as sampled signals at the reverse "Rev" sample port 34. In the preferred embodiment, the power transmission circuits and lines are of about a 50 ohm impedance.

An inherent characteristic of a directional coupler is the AC isolation between the forward sample port 32 and the reverse sample port 34, and vice versa. In other words, signals sampled from the carrier transmitted in a forward direction do not appear at the reverse sample port 34, and signals sampled from reflected power do not appear on the forward sample port 32. Any deviation from this ideal case is referred to as lack of directivity. The forward sample port 32 is, however, DC coupled to the reverse sample port 34 by way of the terminating impedance 36, and vice versa. Thus, any DC signal or bias current applied to the reverse sample port 34 is coupled via the internal terminating impedance 36 to the forward sample port 32.

The RF detector circuit 22 is coupled to the forward sample port 32, whereas the temperature compensation circuit 26 is coupled to the reverse sample port 34. In contrast to the prior art designs, the temperature compensation circuit 26 is not bridged across the RF detector circuit 22 and thus the sensitivity thereof is not compromised or otherwise reduced.

The RF detector circuit 22 includes an RF rectifier diode 40 for providing halfwave rectification of the sampled power signals existing at the forward sample port 32 of the directional coupler 20. Connected to the cathode of the rectifier diode 40 is a filter capacitor 42 and a load resistor 44. The various values of the components of the RF detector 22 are selected so as to provide a DC output voltage on line 46, as a function of the forward RF power carried on the main line 28 of the directional coupler 20. This means the voltage output by the detector circuit 22 on line 46 is basically a DC voltage which is a representation of the output power of the power amplifier 18. In the preferred embodiment of the invention, the transceiver operates at about 850 MHZ. One terminal of the filter capacitor 42 and the resistor 44 are connected to a circuit common connection, such as ground.

The temperature compensation circuit 26 includes relatively few components, most of which are not high precision components, thereby providing a cost effective compensation circuit. The reflected power signals provided at the reverse sample port 34 are preferably terminated to ground by a low AC-impedance capacitor 50. As such, the reflected signals sampled by the directional coupler 20 are eliminated or otherwise substantially attenuated so as to provide no effect on the temperature compensation circuit 26.

A bias current for temperature compensation purposes is coupled to the reverse sample port 34 via the circuit node 52. The temperature compensation bias current is derived from a temperature independent DC bias voltage generated by a reference voltage 61. In the preferred embodiment this is any stable voltage available greater than about two volts. A resistor divider comprised of resistor 54 and resistor 56 scale down the voltage and increase the impedance of the voltage reference 61. The junction 60 of resistors 54 and 56 is coupled to the bias current node 52 via a series resistor 58. The value of series resistor 58 is sufficiently large, as compared to the resistance of resistors 54 and 56, so as to function as a current source in providing a relatively constant current to node 52. Resistors 54, 56 and 58 combine to provide the desired DC bias current and impedance with respect to the bias current node 52. As can be appreciated, resistors 54 and 56 could be eliminated and a precision voltage reference coupled directly to the node 60. In like manner, resistor 58 can be eliminated, and the divider resistors 54 and 56 can be selected as precision tolerance resistors. Resistors 54, 56 and 58 could be eliminated and a precision current source coupled directly to node 52. However, the arrangement shown in FIG. 2 is the best performing and most cost effective. Other circuit arrangements can be devised by those skilled in the art to provide a constant DC current to the node 52.

The temperature compensated bias current at node 52 is determined primarily by the second source of resistor 62 in series with diode 64. This compensation current is coupled via the reverse sample port 34 and the coupled line 30 of the directional coupler 20 to the forward sample port 32, and thus to the RF detector diode 40. The function of the temperature compensation circuit 26 is to track and hold constant the bias current supplied to the rectifier diode 40 and to offset any adverse electrical characteristics thereof due to changes in temperature.

In order to provide an accurate compensation for changes in temperature, the RF rectifier diodes 40 and 64 have matched electrical characteristics and are subjected to the same temperature changes. This is accomplished by employing diodes fabricated under the same conditions and packaged in the same integrated circuit or case. In the preferred embodiment, matched diodes 40 and 64 are available in integrated circuit form as a Siemens BAT 62 device.

As noted previously, it is also important that diodes 40 and 64 operate at the same bias current conditions. To that end, resistors 62 and 44 are also selected with substantially identical resistance so that each such diode maintains the same magnitude of current carried therethrough at a given reference temperature. The value of the terminating impedance 36 is much smaller than the value of resistors 62 and 44. In other circuit configurations, the corresponding resistors 44 and 62 may not be equal, but due to other circuit components the current through the diodes 40 and 64 would nevertheless be substantially equal at a reference temperature.

While not shown, the DC signal on line 46 output by the RF detector 22 is preferably coupled to the input of an operational amplifier, which has a characteristic high impedance.

Figure 3:
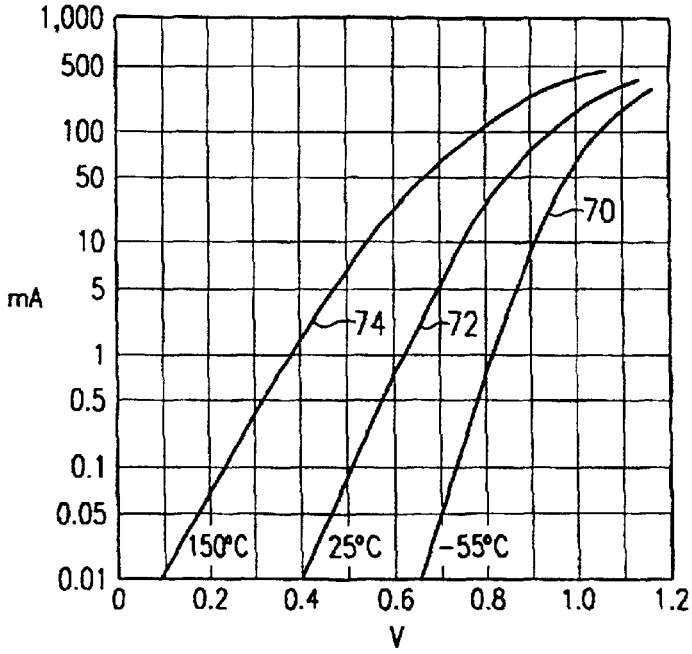
FIG. 3 illustrates in graphical form the current and the voltage parameters of a semiconductor diode, as a function of temperature.

With reference to FIG. 3, there is illustrated typical voltage-current characteristics of a conventional silicon diode, as a function of changes in temperature. It is noted that the horizontal axis is a measure of the forward junction voltage of the diode, and is a linear scale. On the other hand, the vertical axis represents a logarithmic scale of diode current, as measured in milliamps. The graphical curve 70 represents the current-voltage characteristics of the exemplary silicon diode operating at a temperature of −55° C. Curve 72 illustrates the electrical characteristics of such a diode operating at a temperature of 25° C., while curve 74 shows the electrical diode characteristics at 150° C. It is typically recognized that the junction voltage of semiconductor devices changes about 1–2 mv in an inverse relationship for each 1° C. temperature change. As can be seen, with increases in the operating temperature of the diode, the forward junction voltage decreases. If, for example, it were desired to maintain the forward junction voltage of the silicon diode at 0.6 volts over a wide temperature range, the following would be required. It is noted from FIG. 3 that at room temperature of about 25° C., a junction voltage of 0.6 volts corresponds to a diode current of about 0.7–0.8 milliamp. If, for example, the forward junction voltage of 0.6 were required under a diode operating temperature of 150° C., then the current through the diode must be increased to about 30 milliamp. The same analysis can be carried out to determine which forward junction voltages must be employed to maintain an essentially constant current through the diode under a range of temperatures.

The operation of the circuit shown in FIG. 2 is better understood in connection with the following example. Assuming that no temperature compensating current is provided, the RF detector 22 operates in the following manner. For a given, constant RF power carried by the main line 28 of the directional coupler 20, the RF rectifier 40 will carry a given rectified signal current. The current will be converted to a filtered voltage by capacitor 42. Importantly, the DC output voltage on line 46 is a function of the forward junction voltage of rectifier diode 40, which changes with temperature. Thus, if the temperature of the rectifier diode 40 increases, the forward junction voltage decreases, as noted in FIG. 3. The reduced junction voltage of the rectifier diode 40 represents a lower impedance in the detector circuit 22, whereby the diode current in the circuit increases. Because of the decrease in the junction voltage of the RF rectifier diode 40, the voltage across the load resistor 44 will increase and the voltage on the DC output line 46 will increase correspondingly. The increase in the voltage on line 46 is otherwise interpreted by the power control circuit 24 (FIG. 1) as an increase in the transmitted RF power. This inaccuracy in the RF detector circuit 22 due to a change in temperature, causes the power control circuit 24 to reduce the power transmitted by the power amplifier 18. Obviously, this is an erroneous change in the transmitted power, due to an uncompensated change in the temperature of rectifier diode 40. As noted above, diode rectifiers are routinely incorporated into RF detector circuits.

Assuming the availability of the invention, as noted in the preferred embodiment shown in FIG. 2, the temperature compensation circuit 26 provides a compensating current to the rectifier diode 40 to offset the change in junction voltage due to the increase in temperature noted in the example. As noted above, the RF rectifier diode 40 and the compensation diode 64 undergo the same temperature changes, and the circuits are configured so that each diode maintains essentially the same magnitude of bias current flowing therethrough for all practical temperatures. Thus, the electrical characteristics of the RF rectifier diodes 40 and 64 track each other with corresponding changes in temperature.

It is thus the objective to make the current through the detector load resistor 44 insensitive to temperature by the utilization of the temperature compensation circuit 26, but without placing a load on the detector circuit 22. Assuming an increase in the ambient temperature of the matched diodes 40 and 64, the semiconductor junction voltages will decrease, but the voltage at node 52 will decrease correspondingly, thus maintaining a constant current through resistors 44 and 62. With a decrease in the ambient temperature, the junction voltages of the diodes 40 and 64 increase, the voltage at node 52 increases correspondingly, and thus the current through the resistors 44 and 62 remains the same, despite the change in temperature. Those skilled in the art will readily appreciate that any change in the transmitted power through the directional coupler 20 will indeed change the current through the detector load resistor 44, which is the desired result.

In accordance with an important feature of the invention, the coupling of the temperature compensation circuit 26 to the reverse sample port 34 of the coupler 20 does not provide a loading effect on the forward sample port 32. As a result, the temperature compensation circuit 26 does not provide a shunting effect on the signals at the forward sample port 32, which would otherwise reduce the sensitivity of the RF detector 22 to the sensing of power transmitted forwardly on the main line 28 of the directional coupler 20. As such, the reverse sample port 34 is not utilized in accordance with the invention for measuring the reflected power, but rather is utilized as a means for coupling a temperature compensated DC bias signal to the RF rectifier diode 40 without loading or otherwise shunting the RF detector circuit 22. As noted above, the temperature compensating arrangement according to the preferred embodiment does not require numerous components, or precision tolerance components to maintain temperature compensation over a wide range of operating temperatures. In practice, it has been found that with resistors 62 and 44 being only five percent tolerance components, accurate temperature compensation can be provided over a wide range of −30° C. to +100° C. Indeed, if temperature compensation is to be provided over even a greater range of temperatures, smaller tolerance resistors and components can be employed. It is believed that while RF rectifier diodes are employed as matched pairs in the preferred embodiment of the invention, those skilled in the art may prefer to utilize RF transistors and associated components with equal effectiveness for providing rectification and temperature compensation. The entire concept could even be incorporated into a single integrated circuit, with or without the other components of the system already mentioned.

From the foregoing, disclosed is a temperature compensated detector that is highly accurate over a wide temperature range, does not require expensive components, and can provide improved sensitivity to low level power measurements. The sensitivity of the RF detector is provided with temperature compensated currents by utilizing the internal coupling arrangement between the reverse sampling port and the forward sampling port of a directional coupler. The inherent isolation between such ports reduces the loading of the temperature compensation circuits on the detector circuit.

While the preferred embodiment of the invention has been disclosed with reference to a specific detector and temperature compensation circuit, and methods of operation thereof, it is to be understood that many changes in detail may be made as a matter of engineering choices, without departing from the spirit and scope of the invention, as defined by the appended claims.

What is claimed is:

[1. A temperature compensated detector, comprising:

a first conductor carrying signals to be detected;

a second conductor carrying signals electromagnetically induced therein from said first conductor;

a detector including a rectifier for providing an output signal representative of the signal carried by said first conductor; and a temperature compensation circuit providing a compensating bias signal to said detector, said compensating circuit being connected in a manner to provide compensating bias signals to said detector so as to prevent loading thereof.]

[2. The temperature compensated detector of claim 1, wherein said first conductor and said second conductor comprise a directional coupler.]

[3. The temperature compensated detector of claim 2, wherein said detector is coupled to a terminal of said directional coupler for sensing a forward signal carried by said first conductor, and said temperature compensation circuit is connected to a different terminal of said directional coupler.]

[4. The temperature compensated detector of claim 3, wherein said different terminal comprises a reverse sample port that is AC terminated to a reference impedance.]

[5. The temperature compensated detector of claim 1, wherein said detector and said temperature compensation circuit each include a rectifier diode, and including corresponding circuitry for providing substantially an equal magnitude bias current to flow through each said diode.]

[6. The temperature compensated detector of claim 1, wherein said rectifier comprises a semiconductor diode.]

[7. The temperature compensated detector of claim 1, wherein said temperature compensation circuit includes a current source for sourcing substantially a constant current between said temperature compensation circuit and said detector, a magnitude of said current being substantially independent of temperature.]

[8. The temperature compensated detector of claim 7, further including a matched pair of semiconductor diodes, a first diode located in said detector and a second diode located in said temperature compensation circuit, and said current source sources current between said diodes.]

[9. The temperature compensated detector of claim 8, wherein said current source is configured to provide a constant current that is independent of temperature.]

[10. A temperature compensated detector, comprising:

a directional coupler having an input port, an output port, a forward sample port and a reverse sample port;

a detector circuit including a rectifier, said detector circuit coupled to said forward sample port; and a temperature compensation circuit coupled to said reverse sample port, said temperature compensation circuit providing a compensating bias to said detector circuit via said reverse sample port.]

[11. The temperature compensated detector of claim 10, wherein said detector circuit and said temperature compensation circuit each include a semiconductor diode of a matched diode pair, and each said diode carries substantially the same magnitude of DC bias current, and the magnitude of said bias current is independent of temperature.]

[12. The temperature compensated detector of claim 10, further including in combination a wireless transceiver, and wherein said temperature compensated detector is coupled between an amplifier and a load for controlling a power transmitted by said amplifier to said load.]

[13. A method of providing temperature compensation to a detector, comprising the steps of:

coupling RF power to a directional coupler and therefrom to a load;

rectifying a signal provided at a forward sample port of said directional coupler to provide a DC voltage representative of the RF power; and generating a DC bias signal that is independent of a rectifier temperature and coupling said DC bias signal to said forward sample port of the directional coupler, via a reverse sample port.]

[14. The method of claim 13, further including providing a matched pair of rectifier diodes, one rectifier diode coupled to said reverse port and another rectifier diode coupled to said reverse sample port.]

[15. The method of claim 13, further including terminating AC signals at said reverse sample port to a common circuit node.]

[16. A temperature compensated detector, comprising:

a four-port directional coupler having an input port, an output port, a forward sample port and a reverse sample port;

a detector circuit coupled to said forward sample port, said detector circuit including a first semiconductor diode, a filter and an output providing a voltage corresponding to a signal carried between the input port and the output port of said directional coupler; and a temperature compensation circuit coupled to said reverse sample port, said temperature compensation circuit including a current source and a second semiconductor diode, said current source being configured to source substantially the same amount of current between said first and second semiconductor diodes as the temperature changes.]

[17. The temperature compensated detector of claim 16, wherein said first and second semiconductor diodes have matched electrical characteristics.]

*18. A temperature compensated detector for an input signal, comprising:*

*a directional coupler having an input port for receiving said input signal, an output port, a forward sample port and a reverse sample port;*

*a detector circuit, which includes a first rectifier, for producing an output signal representing the amplitude of said input signal, said detector circuit connected to said input port of said coupler;*

*a temperature compensation circuit which includes a current source that provides a DC bias current to a node from which said bias current is divided into first and second currents which flow through respective first and second circuit paths, said second path including a second rectifier;*

*said first path extending from said node through said reverse sample port of said coupler, said forward sample port of said coupler and through said first rectifier of said detector circuit; and*

*said first path and said second path having substantially equal resistance wherein said first and second currents are substantially equal.*

*19. The temperature compensated detector of claim 18 wherein said current source is a temperature compensated constant current source.*

*20. The temperature compensated detector of claim 18 wherein said first path includes a first resistor connected in series with said first rectifier between said node and a common terminal and said second path includes a second resistor in series with said second rectifier between said node and said common terminal.*

*21. The temperature compensated detector of claim 20 wherein said detector circuit includes a first capacitor connected in parallel with said first resistor and said temperature compensation circuit includes a second capacitor connected in parallel with said second rectifier.*

*22. The temperature compensated detector of claim 18 wherein said first and second rectifiers are matched diodes.*

*23. The temperature compensated detector of claim 18 wherein said detector circuit is an RF detector circuit.*

*24. The temperature compensated detector of claim 18, further including in combination a wireless transceiver and wherein said temperature compensated detector is coupled between an amplifier, said amplifier providing said input signal, and a load for controlling a power transmitted by said amplifier to said load.*

*25. A temperature compensated detector for an input signal, comprising:*

*a directional coupler having an input port for receiving said input signal, an output port, a forward sample port and a reverse sample port;*

*a detector circuit, which includes a first rectifier connected in series with a first resistor between said forward sample port of said coupler and a common terminal and a first capacitor connected in parallel with said first resistor, for producing an output signal at a junction node between said first rectifier and said first capacitor, said output signal representing the amplitude of said input signal;*

*a temperature compensation circuit which includes a constant current source that provides a DC bias current*

*to a first node from which said bias current is divided into first and second currents which flow through respective first and second circuit paths, said second path having a second rectifier connected in series with a second resistor between said first node and said common terminal;*

*said first path extending from said first node through said reverse sample port of said coupler, said forward sample port of said coupler, said first rectifier and said first resistor of said detector circuit to said common terminal; and*

*said first path and said second path having substantially equal resistance wherein said first and second currents are substantially equal.*

*26. The temperature compensated detector of claim 25 wherein said constant current source is temperature compensated.*

*27. The temperature compensated detector of claim 25 wherein said first rectifier is matched to said second rectifier and said first and second resistors have substantially the same resistance.*

*28. The temperature compensated detector of claim 25, further including in combination a wireless transceiver and wherein said temperature compensated detector is coupled between an amplifier, said amplifier providing said input signal, and a load for controlling a power transmitted by said amplifier to said load.*

*29. A temperature compensated detector for an input signal, comprising:*

*a first conductive line for carrying said input signal;*

*a second conductive line proximate said first conductive line, said second conductive line for carrying electromagnetically induced signals from said first conductive line, said second conductive line having first and second terminals,*

*a detector circuit, which includes a first rectifier, for producing an output signal representing the amplitude of said input signal, said detector circuit connected to said first terminal of said second conductive line;*

*a temperature compensation circuit which includes a current source that provides a DC bias current to a node from which said bias current is divided into first and second currents which flow through respective first and second circuit paths, said second path including a second rectifier;*

*said first path extending from said node through said second terminal of said second conductive line, said second conductive line, said first terminal of said second conductive line, and said first rectifier of said detector circuit; and*

*said first path and said second path having substantially equal resistance wherein said first and second currents are substantially equal.*

*30. The temperature compensated detector of claim 29 wherein said current source is a temperature compensated constant current source.*

*31. The temperature compensated detector of claim 29 wherein said first path includes a first resistor in series with said first rectifier between said node and a common terminal and said second path includes a second resistor in series with said second rectifier between said node and said common terminal.*

*32. The temperature compensated detector of claim 31 wherein said detector circuit includes a first capacitor connected in parallel with said first resistor and said temperature compensation circuit includes a second capacitor connected in parallel with said second rectifier.*

*33. The temperature compensated detector of claim 29 wherein said first and second rectifiers are matched diodes.*

*34. The temperature compensated detector of claim 29 wherein said detector circuit is an RF detector circuit.*

*35. The temperature compensated detector of claim 29 wherein said first and second conductive lines are part of a directional coupler.*

*36. The temperature compensated detector of claim 29, further including in combination a wireless transceiver and wherein said temperature compensated detector is coupled between an amplifier, said amplifier providing said input signal, and a load for controlling a power transmitted by said amplifier to said load.*

*37. A temperature compensated detector for an input signal, comprising:*

*a first conductive line for carrying said input signal;*

*a second conductive line proximate to said first conductive line, said second conductive line for carrying electromagnetically induced signals from said first conductive line, said second conductive line having first and second terminals;*

*a detector circuit, which includes a first rectifier connected in series with a first resistor between said first terminal of said second conductive line and a common terminal, and a first capacitor connected in parallel with said first resistor, for producing an output signal at a junction node between said first rectifier and*

*said first capacitor, said output signal representing the amplitude of said input signal;*

*a temperature compensation circuit which includes a constant current source that provides a DC bias current to a node from which said bias current is divided into first and second currents which flow through respective first and second circuit paths, said second path having a second rectifier connected in series with a second resistor between said node and said common terminal;*

*said first path extending from said node through said second terminal of said second conductor, said second conductor, said first terminal of said second conductor, said first rectifier and said first resistor of said detector circuit to said common terminal; and*

*said first path and said second path having substantially equal resistance wherein said first and second currents are substantially equal.*

*38. The temperature compensated detector of claim 37 wherein said constant current source is temperature compensated.*

*39. The temperature compensated detector of claim 37 wherein said first rectifier is matched to said second rectifier and said first and second resistors have substantially the same resistance.*

*40. The temperature compensated detector of claim 37, further including in combination a wireless transceiver and wherein said temperature compensated detector is coupled between an amplifier, said amplifier providing said input signal, and a load for controlling a power transmitted by said amplifier to said load.*

* * * * *